(12) United States Patent
Li et al.

(10) Patent No.: US 10,084,095 B2
(45) Date of Patent: Sep. 25, 2018

(54) THIN FILM TRANSISTOR, METHOD FOR MANUFACTURING THE SAME, AND ARRAY SUBSTRATE

(71) Applicant: BOE TECHNOLOGY GROUP CO., LTD., Beijing (CN)

(72) Inventors: Xiaolong Li, Beijing (CN); Zheng Liu, Beijing (CN); Xiaoyong Lu, Beijing (CN); Chunping Long, Beijing (CN); Huijuan Zhang, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 15/322,490

(22) PCT Filed: Mar. 1, 2016

(86) PCT No.: PCT/CN2016/075201
§ 371 (c)(1),
(2) Date: Dec. 28, 2016

(87) PCT Pub. No.: WO2016/150277
PCT Pub. Date: Sep. 29, 2016

(65) Prior Publication Data
US 2017/0162703 A1 Jun. 8, 2017

(30) Foreign Application Priority Data

Mar. 20, 2015 (CN) .......................... 2015 1 0125633

(51) Int. Cl.
*H01L 31/0312* (2006.01)
*H01L 29/786* (2006.01)
(Continued)

(52) U.S. Cl.
CPC .... *H01L 29/78609* (2013.01); *H01L 21/0262* (2013.01); *H01L 21/02527* (2013.01);
(Continued)

(58) Field of Classification Search
CPC ...................... H01L 29/66772–29/6678; H01L 29/78654–29/78657; H01L 29/78696;
(Continued)

(56) References Cited

U.S. PATENT DOCUMENTS 5,903,015 A * 5/1999 Shiomi ............... H01L 29/1029
257/280
8,546,259 B2 * 10/2013 DeLoach .......... H01L 21/26506
257/E21.296

(Continued)

FOREIGN PATENT DOCUMENTS

CN 1312589 A 9/2001
CN 1627535 A 6/2005
(Continued)

OTHER PUBLICATIONS

Written Opinion of the International Searching Authority from corresponding PCT Application No. PCT/CN2016/075201, dated Jun. 12, 2016 (5 pages).
(Continued)

*Primary Examiner* — Kevin M Picardat
(74) *Attorney, Agent, or Firm* — Harness, Dickey & Pierce, P.L.C.

(57) ABSTRACT

The embodiments of present disclosure provide a thin film transistor, a method for manufacturing the same, and an array substrate. The thin film transistor comprises an active layer provided on a substrate, the active layer including a middle channel region, a first high resistance region and a second high resistance region provided respectively on external sides of the middle channel region, a source region provided on an external side of the first high resistance region and a drain region provided on an external side of the second high resistance region, wherein a base material of the active layer is diamond single crystal. According to the thin film transistor, the method for manufacturing the same, and
(Continued)

the array substrate provided in the embodiments of present disclosure, by providing high resistance regions on external sides of the middle channel region of the active layer, the carrier mobility is reduced and the leakage current of the thin film transistor made of single crystalline diamond is effectively suppressed.

13 Claims, 2 Drawing Sheets

(51) Int. Cl.
    *H01L 29/04*     (2006.01)
    *H01L 29/16*     (2006.01)
    *H01L 29/66*     (2006.01)
    *H01L 21/04*     (2006.01)
    *H01L 21/02*     (2006.01)

(52) U.S. Cl.
    CPC .. *H01L 21/02598* (2013.01); *H01L 21/02609* (2013.01); *H01L 21/02664* (2013.01); *H01L 21/043* (2013.01); *H01L 29/045* (2013.01); *H01L 29/1602* (2013.01); *H01L 29/66045* (2013.01); *H01L 29/78621* (2013.01); *H01L 29/78684* (2013.01); *H01L 29/78696* (2013.01)

(58) Field of Classification Search
    CPC .............................. H01L 29/04–29/045; H01L 29/0856–29/0869; H01L 29/0873–29/0886; H01L 21/823412; H01L 21/823807; H01L 21/66492
    USPC .......................................................... 257/77
    See application file for complete search history.

(56) References Cited

U.S. PATENT DOCUMENTS

| | | | |
|---|---|---|---|
| 2005/0127373 | A1 | 6/2005 | Yokota et al. |
| 2008/0134959 | A1* | 6/2008 | Kasu .................... C23C 16/274 117/84 |
| 2014/0264391 | A1* | 9/2014 | Yamazaki ......... H01L 29/42384 257/79 |
| 2015/0060844 | A1* | 3/2015 | Miyairi ............... H01L 29/7869 257/43 |

FOREIGN PATENT DOCUMENTS

| | | |
|---|---|---|
| CN | 1645611 A | 7/2005 |
| CN | 101527331 A | 9/2009 |
| CN | 102403209 A | 4/2012 |
| CN | 104241390 A | 12/2014 |
| CN | 104659109 A | 5/2015 |
| JP | H08-274342 | 10/1996 |

OTHER PUBLICATIONS

Office Action from corresponding Chinese Application No. 201510125633.X, dated Jan. 26, 2017 (7 pages).

* cited by examiner

THIN FILM TRANSISTOR, METHOD FOR MANUFACTURING THE SAME, AND ARRAY SUBSTRATE

CROSS-REFERENCE TO RELATED APPLICATIONS

This application claims priority of Chinese Patent Application No. 201510125633.X filed on Mar. 20, 2015, the entire disclosure of which is incorporated herein by reference as a part of this application.

TECHNICAL FIELD

Embodiments of present disclosure relate to a thin film transistor, a method for manufacturing the same, and an array substrate.

BACKGROUND

Commonly used flat display panels include Liquid Crystal Display (LCD) panels and Organic Light-Emitting Diode (OLED) display panels. An LCD display panel or an OLED display panel includes an array substrate. The array substrate includes a plurality of pixel circuits arranged in an array and consisting of thin film transistors (TFTs), and each pixel circuit corresponds to one subpixel unit. Thin film transistor, as a control switch of a display panel pixel, is directly related to a developing trend for high-performance flat display panels.

Currently, a thin film transistor in an array substrate includes a gate, a source and a drain as well as an active layer formed between the source/drain and the gate. In order to improve performance of a display panel, it is necessary to improve carrier mobility of the active layer as much as possible. Diamond single crystal has a high carrier mobility and good TFT properties, and is a potentially excellent material for the next-generation TFTs. However, due to the high mobility of this material, leakage current of the TFT device is large, which has an adverse impact on operation characteristics of the TFT device. If such an impact lasts for a long period of time, TFT characteristics will deteriorate and quality of products will decline.

SUMMARY OF THE INVENTION

Embodiments of present disclosure provide a thin film transistor, a method for manufacturing the same, and an array substrate, so as to reduce leakage current of the thin film transistor.

In a first aspect, the embodiments of present disclosure provide a thin film transistor, comprising an active layer provided on a substrate, the active layer including a middle channel region, a first high resistance region and a second high resistance region provided respectively on external sides of the middle channel region, a source region provided on an external side of the first high resistance region, and a drain region provided on an external side of the second high resistance region, wherein a base material of the active layer is diamond single crystal.

Those skilled in the art can understand that the "external side" herein is relative to a center of the thin film transistor.

Further, a base material of the middle channel region, the source region and the drain region is (111)-face diamond single crystal, and a base material of the first high resistance region and the second high resistance region is (100)-face diamond single crystal.

Further, the active layer has been treated with plasma and polar gas.

Further, the thin film transistor further comprises a source electrode provided on the source region, a drain electrode provided on the drain region, and a carbonized metal layer provided between the source electrode and the source region and between the drain electrode and the drain region.

Further, the thin film transistor further comprises a gate insulating layer and a gate electrode, wherein the gate insulating layer is provided on the active region and the gate electrode is provided on the gate insulating layer; the gate insulating layer is provided with a first via-hole exposing the source region and a second via-hole exposing the drain region; the source electrode and the drain electrode are formed in the first via-hole of the source region and the second via-hole of the drain region, respectively.

In a second aspect, the embodiments of present disclosure further provide an array substrate comprising above thin film transistor.

In a third aspect, the embodiments of present disclosure further provide a method for manufacturing a thin film transistor, comprising:

depositing diamond single crystal on a substrate, the diamond single crystal forming an active layer;

providing a first high resistance region and a second high resistance region on external sides of a middle channel region of the active layer respectively; and doping a region of the active layer on an external side of the first high resistance region and a region of the active layer on an external side of the second high resistance region to form a source region and a drain region respectively.

Further, the deposited diamond single crystal is (111)-face diamond single crystal; and the providing a first high resistance region and a second high resistance region on external sides of a middle channel region of the active layer respectively comprises:

etching away (111)-face diamond single crystal in a predetermined first high resistance region and a predetermined second high resistance region, and depositing (100)-face diamond single crystal in the predetermined first high resistance region and the predetermined second high resistance region.

Further, the method further comprises:

forming a gate insulating layer on the active layer, and forming a gate electrode on the gate insulating layer; and etching a first via-hole and a second via-hole in the source region and the drain region respectively, and depositing metal in the first via-hole and the second via-hole respectively to form a source electrode and a drain electrode.

Further, the method further comprises:

performing a rapid thermal annealing treatment on the source electrode and the drain electrode to form a carbonized metal layer between the source electrode and the source region and between the drain electrode and the drain region respectively.

Further, the depositing diamond single crystal on a substrate comprises:

depositing (111)-face diamond single crystal on the substrate, wherein a deposition temperature is 780-850° C., a deposition pressure is 16-18 KPa, a flow ratio of methane to hydrogen gas is 0.5%-1%, a deposition power is 3-5 KW, a deposition rate is 0.01-0.02 μm/min, and a deposition period is 10-15 mins.

Further, a deposition condition for the depositing (100)-face diamond single crystal in the predetermined first high resistance region and the predetermined second high resistance region includes a deposition temperature of 900-1000°

C., a deposition pressure of 21-23 KPa, a flow ratio of methane to hydrogen gas of 3%-4%, a deposition power of 5-7 KW, a deposition rate of 0.1-0.2 μm/min, and a deposition period of 2-3 mins.

As can be seen from the technical solutions above, the embodiments of present disclosure provide a thin film transistor, a method for manufacturing the same, and an array substrate, wherein the thin film transistor is provided with high resistance regions on external sides of the middle channel region of the active layer, thereby reducing the carrier mobility and effectively suppressing the leakage current of the thin film transistor made of single crystal diamond.

BRIEF DESCRIPTION OF THE DRAWINGS

For the sake of illustrating the technical solutions of the embodiments of present disclosure more clearly, a brief introduction to drawings of the embodiments is made as follows. Apparently, the following drawings merely relate to some embodiments of present disclosure, and do not limit present disclosure.

DETAILED DESCRIPTION OF THE INVENTION

Figure 1:
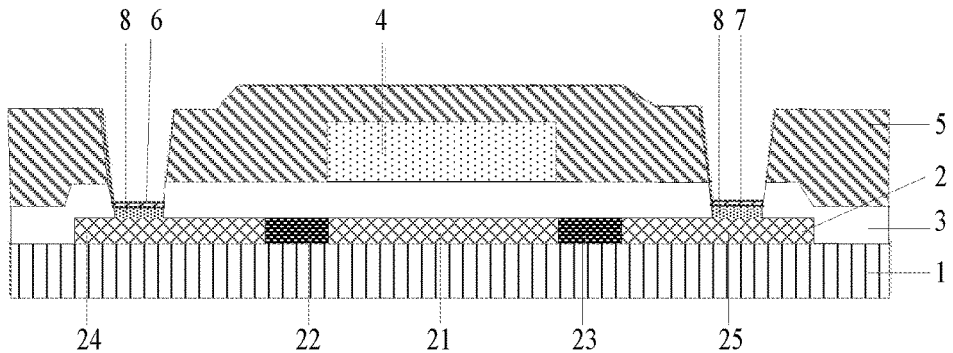
FIG. 1 is a structural diagram of a thin film transistor provided in an embodiment of present disclosure.

The technical solutions of the embodiments of the present invention will be described clearly and thoroughly hereinafter in conjunction with the drawings in respective embodiments in order to make the objects, technical solutions and advantages of the embodiments of the disclosure more clear. Obviously, the embodiments described are only some rather than all of the embodiments of the disclosure. All other embodiments obtained by one ordinary person skilled in the art based on the described embodiments in the disclosure without creative work are within the scope of the present disclosure.

In the description of the present disclosure, it should be noted that the oriental or positional relationship indicated by the terms "upper", "lower", "top", "bottom" or the like is the oriental or positional relationship shown in the drawings, and such terms are used only for the purpose of description and simplifying the description rather than indicating or suggesting that the device or element indicated must be in a specific orientation, be structured and operated in a specific orientation. Such terms shall not be deemed to limit the scope of the present invention.

Diamond single crystal has high thermal conductivity, wide bandgap, high carrier mobility (>1300 V·S/cm$^2$) and other excellent properties. Therefore diamond can be used as a material for both active devices and passive devices in the field of semiconductor technology. However, due to the high carrier mobility of the diamond single crystal, a semiconductor device made of it has high carrier mobility and thus the leakage current at zero Volt is large ($10^{-10}$-$10^{-7}$ mA). In addition, since a source electrode and a drain electrode are used for current input and output of the semiconductor device, they are generally made of metal. If the diamond single crystal is used as an active layer of a transistor, the contact between electrodes and semiconductor layers is substantially a contact between the metal and the diamond single crystal. A resistance of contact between the metal and the diamond single crystal directly affects the current-voltage (IV) characteristics of the thin film transistor. The larger the contact resistance is, the larger the parasitic resistance between the source and the drain of the device is, which will not only increase power consumption and noise of the circuit but also affect the speed of the circuit. That is, a desired ohmic contact cannot be formed between the diamond single crystal and the metal.

By making use of advantages of the diamond single crystal, the embodiments of present disclosure provide a semiconductor device made with the diamond single crystal, thereby reducing the leakage current of the semiconductor device made of the diamond single crystal.

FIG. 1 shows a structural diagram of a thin film transistor provided in an embodiment of present disclosure. As shown in FIG. 1, the thin film transistor comprises an active layer 2 provided on a substrate 1. The active layer 2 includes a middle channel region 21, a first high resistance region 22 and a second high resistance region 23 provided respectively on external sides of the middle channel region 21, a source region 24 provided on an external side of the first high resistance region 22, and a drain region 25 provided on an external side of the second high resistance region 23. The high resistance region refers to a region whose resistivity is higher than those of the middle channel region, the source region and the drain region.

A base material of the active layer 2 of aforesaid thin film transistor is diamond single crystal. By providing the first high resistance region 22 and the second high resistance region 23 on external sides of the middle channel region 21 of the active layer 2, the carrier mobility is reduced and the leakage current of the thin film transistor can be effectively suppressed.

In the present embodiment, the first high resistance region 22 and the second high resistance region 23 are provided on external sides of the middle channel region 21, the source region 24 is provided on the external side of the first high resistance region 22, and the drain region 25 is provided on the external side of the second high resistance region 23. In this way, when electrons are transmitted in the source region, the channel region and the drain region, they must pass through the first high resistance region 22 and the second high resistance region 23, thereby decreasing a transmission speed and kinetic energy of the electrons and reaching the goal of suppressing leakage current.

Specifically, a base material of the middle channel region, the source region and the drain region is (111)-face diamond single crystal, and a base material of the first high resistance region and the second high resistance region is (100)-face diamond single crystal. On one hand, the use of the diamond single crystals having different crystal orientations reduces the migration of the carriers and suppresses the leakage current of the thin film transistor; on the other hand, the (100)-face diamond single crystal can also be used as a buffer zone due to its low carrier mobility.

It is understandable that a length of the first high resistance region and a length of the second high resistance region are not restricted in this embodiment. The length of the first high resistance region and the length of the second high resistance region can be preset in accordance with actual needs to reduce leakage current while ensuring the conductive property of the thin film transistor to be stable.

In an exemplary embodiment of present disclosure, in order to improve stability of the thin film transistor, the (100)-face diamond single crystal and the (111)-face diamond single crystal in the active layer, i.e., the (111)-face diamond single crystal as a base body of above-described middle channel region, source region and drain region and the (100)-face diamond single crystal as a base body of the first high resistance region and the second high resistance region, are treated with plasma and polar gas. The plasma may be oxygen plasma, and the polar gas may include gas such as $N_2$, $NH_3$ or the like.

In an exemplary embodiment of present disclosure, the thin film transistor further comprises a source electrode 6 provided on the source region 24, a drain electrode 7 provided on the drain region 25, and a carbonized metal layer 8 provided between the source electrode 6 and the source region 24 and between the drain electrode 7 and the drain region 25. By providing the carbonized metal layer between the source electrode 6 and the source region 24 and between the drain electrode 7 and the drain region 25, it is facilitated to form a good ohmic contact between the source electrode and the source region and between the drain electrode and the drain region, thereby improving the stability of the thin film transistor.

In an exemplary embodiment of present disclosure, the thin film transistor further comprises a gate insulating layer 3 and a gate electrode 4, wherein the gate insulating layer 3 is provided on the active region 2 and the gate electrode 4 is provided on the gate insulating layer 3; the gate insulating layer 3 is provided with a first via-hole exposing the source region and a second via-hole exposing the drain region; the source electrode and the drain electrode are formed in the first via-hole of the source region and the second via-hole of the drain region respectively.

In an exemplary embodiment of present disclosure, in order to achieve the electrical insulation between conductor areas and metals inside the thin film transistor and the isolative protection from the surroundings, an interlayer dielectric (ILD) layer 5 is provided on the gate electrode 4. As with the gate insulating layer 3, the interlayer dielectric layer 5 is provided with via-holes at positions of the first via-hole exposing the source region and the second via-hole exposing the drain region in the gate insulating layer 3, and the via-holes are provided at the same positions as the first via-hole and the second via-hole.

In above thin film transistor, by providing high resistance regions on external sides of the middle channel region of the active layer, diamond single crystals having different crystal orientations are used in the high resistance regions and other regions of the active layer, thereby reducing the carrier mobility and effectively suppressing the leakage current of the thin film transistor. Further, the active layer is treated with plasma and polar gas to form a stable channel region. Further, by providing a carbonized metal layer between the source electrode and the source region and between the drain electrode and the drain region, it is facilitated to form a good ohmic contact between the source electrode and the source region and between the drain electrode and the drain region, thereby improving the stability of the thin film transistor.

Figure 2:
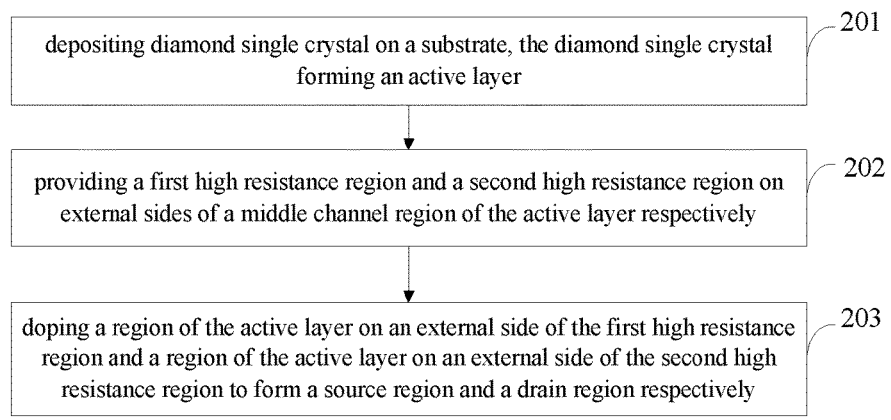
FIG. 2 is a flow diagram of a method for manufacturing a thin film transistor provided in an embodiment of present disclosure.

FIG. 2 shows a flow diagram of a method for manufacturing a thin film transistor provided in an embodiment of present disclosure. As shown in FIG. 2, the method comprises the following steps:

Step 201: depositing diamond single crystal on a substrate, the diamond single crystal forming an active layer;

Step 202: providing a first high resistance region and a second high resistance region on external sides of a middle channel region of the active layer respectively; and Step 203: doping a region of the active layer on an external side of the first high resistance region and a region of the active layer on an external side of the second high resistance region to form a source region and a drain region respectively.

The deposited diamond single crystal may be (111)-face diamond single crystal.

By providing the first and second high resistance regions on external sides of the middle channel region of the active layer, aforesaid method reduces the carrier mobility and effectively suppresses the leakage current of the thin film transistor.

It is noted that the structure of the thin film transistor provided in present embodiment may be an NMOS structure or a PMOS structure. For the sake of convenience of explanation, the following description is made by taking the NMOS structure as an example.

Hereinafter a detailed description to the method for manufacturing a thin film transistor is presented in conjunction with FIGS. 3A-3E.

Figure 3A:
FIGS. 3A-3E are structural diagrams of a process for manufacturing a thin film transistor provided in an embodiment of present disclosure.

Step 201 may specifically comprise depositing (111)-face diamond single crystal on a substrate through a process such as Microwave Plasma Chemical Vapor Deposition (MP-CVD), the diamond single crystal forming an active layer, as shown in FIG. 3A.

In an exemplary embodiment, the (111)-face diamond single crystal is deposited on the substrate, wherein a deposition temperature is 780-850° C., a deposition pressure is 16-18 KPa, a flow ratio of methane to hydrogen gas is 0.5%-1%, a deposition power is 3-5 KW, a deposition rate is 0.01-0.02 μm/min, and a deposition period is 10-15 mins.

The selection of the substrate material primarily depends on the following factors: structural properties, interface properties, chemical stability, thermal properties, electrical conductivity, optical properties and mechanical properties, and these factors need to be taken into consideration when a substrate and a corresponding epitaxial layer are selected. Since silicon is a good heat conductor, a device made of silicon has a good heat conductivity so as to prolong a service life of the device. Therefore in this embodiment, description is made by taking single crystalline silicon substrate as an example. It is noted that in addition to silicon, the substrate material may be silicon carbide (SiC), gallium nitride (GaN), gallium arsenide (GaAs) or the like.

Figure 3B:
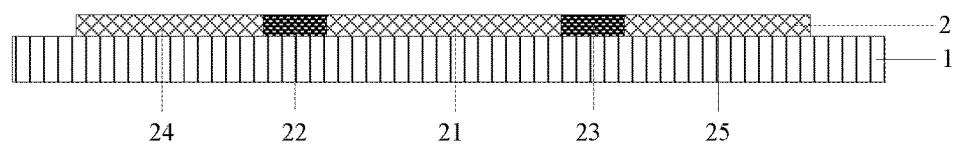

Step 202 may specifically comprise etching away, through a dry etching process, the (111)-face diamond single crystal from the lightly doped source and drain regions of the active layer, i.e., the (111)-face diamond single crystal in a predetermined first high resistance region and a predetermined second high resistance region, and depositing (100)-face diamond single crystal in the predetermined first high resistance region and the predetermined second high resistance region, as shown in FIG. 3B. Due to the use of diamond single crystals having different crystal orientations, the migration of the carriers slows down, thereby suppressing the leakage current of the thin film transistor.

In an exemplary embodiment of present disclosure, the (100)-face diamond single crystal is deposited in the predetermined first high resistance region and the predetermined second high resistance region at a deposition temperature of 900-1000° C., a deposition pressure of 21-23 KPa, a flow ratio of methane to hydrogen gas of 3%-4%, a deposition power of 5-7 KW, a deposition rate of 0.1-0.2 μm/min for a deposition period of 2-3 mins.

Figure 3C:
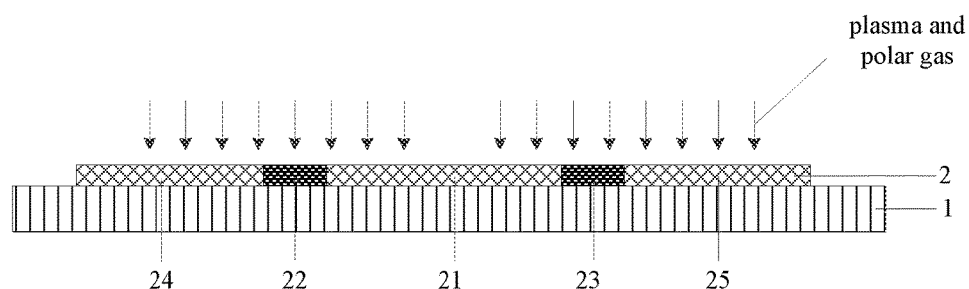

After Step 202, in order to improve the stability of the diamond thin film, in an exemplary embodiment of present disclosure, the diamond base body may be firstly treated with oxygen plasma to form C—O bonds on the surface thereof, and then polar gas (e.g., $N_2$, or $NH_3$ or the like) is introduced into the OVEN chamber so that nitrogen atoms or hydrogen atoms are combined with oxygen. At this time, a stable P channel region is formed below the surface of diamond, thereby enhancing the stability of the device, as shown in FIG. 3C.

In Step 203, a region of the active layer on an external side of the first high resistance region and a region of the active layer on an external side of the second high resistance region are doped to increase the electrical conductivity of these regions. For example, by ion implantation, if the thin film transistor is an N-type one, a region of the active layer on the external side of the first high resistance region and a region of the active layer on the external side of the second high resistance region are doped with a pentavalent impurity element such as phosphorus, arsenic or the like, thereby forming the source region and the drain region respectively.

In another exemplary embodiment of present disclosure, if the thin film transistor is a P-type one, a region of the active layer on the external side of the first high resistance region and a region of the active layer on the external side of the second high resistance region are doped with a trivalent impurity element such as boron, gallium or the like, thereby forming the source region and the drain region respectively.

In an exemplary embodiment of present disclosure, aforesaid method further comprises Step 204 not shown in FIG. 2.

Figure 3D:
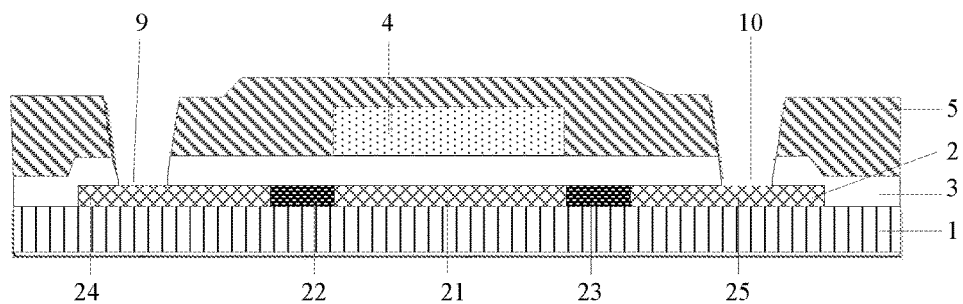

Step 204: forming a gate insulating layer on the active layer and forming a gate electrode on the gate insulating layer; performing implantation of atoms such as B atoms in the source region and the drain region; depositing an ILD layer; and etching a first via-hole and a second via-hole in the source region and the drain region respectively, as shown in FIG. 3D.

In an exemplary embodiment of present disclosure, aforesaid method further comprises Step 205 not shown in FIG. 2.

Figure 3E:
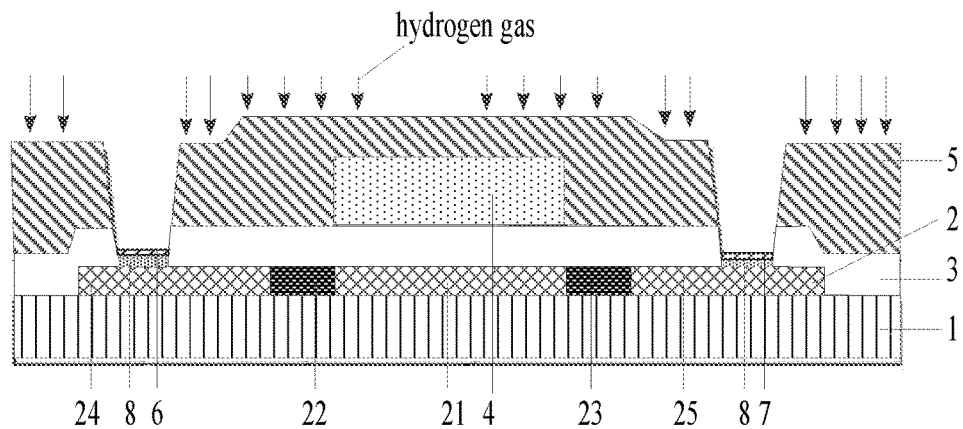

Step 205: depositing, through a self-aligning process, metal on a surface of the source region in the first via-hole 9 and a surface of the drain region in the second via-hole 10 to form a source electrode and a drain electrode, and performing a rapid thermal annealing (RTA) treatment on the source electrode and the drain electrode to form a carbonized metal layer between the source electrode and the source region and between the drain electrode and the drain region respectively, as shown in FIG. 3E.

In an exemplary embodiment of present disclosure, the metal deposited on the surface of the source region and the surface of the drain region may be one or more of W, Ti, Mo and the like, and the rapid thermal annealing (RTA) treatment is performed at a temperature of 450-500° C. for 1-2 hours.

In an exemplary embodiment of present disclosure, Step 205 further comprises hydrotreating above the ILD layer to obtain a better stability of electrical characteristics.

By forming a carbonized metal layer between the source electrode and the source region and between the drain electrode and the drain region in above steps, a good ohmic contact is formed between the source electrode and the source region and between the drain electrode and the drain region, thereby improving the stability of the thin film transistor.

The embodiments of present disclosure further provide an array substrate comprising the thin film transistor according to above embodiments.

The aforesaid embodiments are only exemplary embodiments of the disclosure, and do not intend to limit the scope of the disclosure. The scope of the disclosure is defined by the appended claims.

The invention claimed is:

1. A thin film transistor, comprising:
an active layer positioned on a substrate, the active layer including:
a middle channel region;
a first high resistance region and a second high resistance region positioned respectively on external sides of the middle channel region;
a source region positioned on an external side of the first high resistance region; and
a drain region positioned on an external side of the second high resistance region, wherein a base material of the active layer is diamond single crystal, a base material of the middle channel region, the source region and the drain region is (111)-face diamond single crystal, and a base material of the first high resistance region and the second high resistance region is (100)-face diamond single crystal.

2. The thin film transistor according to claim 1, wherein the active layer is treated with plasma and polar gas.

3. The thin film transistor according to claim 1, further comprising a source electrode positioned on the source region, a drain electrode positioned on the drain region, and a carbonized metal layer positioned between the source electrode and the source region and between the drain electrode and the drain region.

4. The thin film transistor according to claim 3, further comprising a gate insulating layer and a gate electrode, wherein:
the gate insulating layer is positioned on the active region and the gate electrode is positioned on the gate insulating layer;
the gate insulating layer includes a first via-hole exposing the source region and a second via-hole exposing the drain region; and
the source electrode and the drain electrode are positioned in the first via-hole of the source region and the second via-hole of the drain region respectively.

5. An array substrate, comprising the thin film transistor according to claim 1.

6. An array substrate, comprising the thin film transistor according to claim 2.

7. An array substrate, comprising the thin film transistor according to claim 3.

8. An array substrate, comprising the thin film transistor according to claim 4.

9. A method for manufacturing a thin film transistor, the method comprising:
depositing (111)-face diamond single crystal on a substrate, the (111)-face diamond single crystal forming an active layer;
providing a first high resistance region and a second high resistance region on respective external sides of a middle channel region of the active layer by etching away the (111)-face diamond single crystal in a first predetermined region of the active layer where the first high resistance region is to be formed and a second predetermined region of the active layer where the second high resistance region is to be formed, and depositing (100)-face diamond single crystal in the first predetermined region and the second predetermined region; and doping a region of the active layer on an external side of the first high resistance region to form a source region, and doping a region of the active layer on an external side of the second high resistance region to form a drain region.

10. The method for manufacturing a thin film transistor according to claim 9, further comprising:

forming a gate insulating layer on the active layer, and forming a gate electrode on the gate insulating layer;

etching a first via-hole and a second via-hole in the source region and the drain region respectively; and depositing metal in the first via-hole and the second via-hole respectively to form a source electrode and a drain electrode.

11. The method for manufacturing a thin film transistor according to claim 10, further comprising:

performing a rapid thermal annealing treatment on the source electrode and the drain electrode to form respective carbonized metal layers between the source electrode and the source region, and between the drain electrode and the drain region.

12. The method for manufacturing a thin film transistor according to claim 9, wherein a deposition temperature is 780-850° C., a deposition pressure is 16-18 KPa, a flow ratio of methane to hydrogen gas is 0.5%-1%, a deposition power is 3-5 KW, a deposition rate is 0.01-0.02 μm/min, and a deposition period is 10-15 mins.

13. The method for manufacturing a thin film transistor according to claim 9, wherein a deposition condition for depositing (100)-face diamond single crystal in the first predetermined region and the second predetermined region includes a deposition temperature of 900-1000° C., a deposition pressure of 21-23 KPa, a flow ratio of methane to hydrogen gas of 3%-4%, a deposition power of 5-7 KW, a deposition rate of 0.1-0.2 μm/min, and a deposition period of 2-3 mins.

* * * * *